(12) United States Patent
Horikiri et al.

(10) Patent No.: US 9,685,603 B2
(45) Date of Patent: *Jun. 20, 2017

(54) METHOD FOR MANUFACTURING NIOBATE-SYSTEM FERROELECTRIC THIN FILM DEVICE

(71) Applicant: Sumitomo Chemical Company, Limited, Chuo-ku, Tokyo (JP)

(72) Inventors: Fumimasa Horikiri, Nagareyama (JP); Kenji Shibata, Tsukuba (JP); Kazufumi Suenaga, Tsuchiura (JP); Kazutoshi Watanabe, Tsuchiura (JP); Masaki Noguchi, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/171,804

(22) Filed: Jun. 2, 2016

(65) Prior Publication Data

US 2016/0284975 A1 Sep. 29, 2016

Related U.S. Application Data

(63) Continuation of application No. 14/274,787, filed on May 12, 2014, now Pat. No. 9,385,297.

(30) Foreign Application Priority Data

Aug. 29, 2013 (JP) .................................. 2013-178022
Feb. 18, 2014 (JP) .................................. 2014-028155

(51) Int. Cl.
*H01L 41/332* (2013.01)
*H01L 41/187* (2006.01)
(Continued)

(52) U.S. Cl.
CPC ...... *H01L 41/1873* (2013.01); *H01L 41/0805* (2013.01); *H01L 41/314* (2013.01); *H01L 41/316* (2013.01); *H01L 41/332* (2013.01)

(58) Field of Classification Search
CPC ............. H01L 41/0805; H01L 41/1873; H01L 41/081; H01L 41/332; H01L 41/316
See application file for complete search history.

(56) References Cited

U.S. PATENT DOCUMENTS

2010/0112728 A1* 5/2010 Korzenski .............. C09K 13/08
438/3
2011/0074251 A1 3/2011 Shibata et al.
(Continued)

FOREIGN PATENT DOCUMENTS

JP 2000-031133 A 1/2000
JP 2000031133 A * 1/2000
(Continued)

OTHER PUBLICATIONS

European Search Report dated Jan. 9, 2015 (six pages).

*Primary Examiner* — Kyoung Lee
*Assistant Examiner* — Christina Sylvia
(74) *Attorney, Agent, or Firm* — Crowell & Moring LLP

(57) ABSTRACT

There is provided a method for manufacturing a niobate-system ferroelectric thin film device, including: a lower electrode film formation step of forming a lower electrode film on a substrate; a niobate-system ferroelectric thin film formation step of forming a niobate-system ferroelectric thin film on the lower electrode film; an etch mask formation step of forming a desired etch mask pattern on the niobate-system ferroelectric thin film; and a ferroelectric thin film etching step of forming a desired fine pattern of the niobate- (Continued)

system ferroelectric thin film by wet etching using an etchant including an aqueous alkaline solution of a chelating agent.

16 Claims, 5 Drawing Sheets

(51) Int. Cl.
  *H01L 41/08* (2006.01)
  *H01L 41/316* (2013.01)
  *H01L 41/314* (2013.01)

(56) References Cited

U.S. PATENT DOCUMENTS

| | | |
|---|---|---|
| 2012/0025667 A1 | 2/2012 | Horikiri et al. |
| 2013/0038176 A1 | 2/2013 | Horikiri et al. |
| 2015/0229290 A1 | 8/2015 | Suenaga et al. |

FOREIGN PATENT DOCUMENTS

| | | | |
|---|---|---|---|
| JP | 2007-19302 A | | 1/2007 |
| JP | 2012-33693 A | | 2/2012 |
| JP | 2012-244090 A | | 12/2012 |
| JP | 2012244090 A | * | 12/2012 |
| JP | 2013-102089 A | | 5/2013 |
| WO | WO 2010/039936 A2 | | 4/2010 |

* cited by examiner

METHOD FOR MANUFACTURING NIOBATE-SYSTEM FERROELECTRIC THIN FILM DEVICE

CLAIM OF PRIORITY

This application is a continuation of U.S. application Ser. No. 14/274,787, filed on May 12, 2014, which claims priority from Japanese patent application serial no. 2014-028155 filed on Feb. 18, 2014, which further claims priority from Japanese patent application serial no. 2013-178022 filed on Aug. 29, 2013, the contents of which are hereby incorporated by reference into this application.

BACKGROUND OF THE INVENTION

1. Field of the Invention

The present invention relates to technologies regarding ferroelectric thin film devices and particularly to methods for manufacturing lead-free niobate-system ferroelectric thin film devices.

2. Description of Related Art

Ferroelectrics are very attractive substances because of their peculiar characteristics (such as very high relative permittivity, and good pyroelectric, piezoelectric and ferroelectric properties). So, various devices (such as ceramic multilayer capacitors, pyroelectric devices, piezoelectric devices and ferroelectric memories) have been developed and put into use utilizing such peculiar properties. Typical ferroelectrics are perovskite materials such as barium titanate ($BaTiO_3$) and lead zirconate titanate ($Pb(Zr_{1-x}Ti_x)O_3$, PZT). Of these, lead zirconate titanates (PZTs) provide relatively excellent polarization and piezoelectric properties and are therefore most widely used.

Lead-containing PZTs are specified hazardous substances. However, because there are currently no suitable commercially available alternative pyroelectric or piezoelectric materials, PZTs are exempt from the RoHS directive (the directive on the restriction of the use of specified hazardous substances in electrical and electronic equipment enforced by the European Union and Council of Europe). However, with the growing worldwide responsibility towards global environment conservation, a strong demand exists for development of pyroelectric and piezoelectric devices using lead-free ferroelectric materials.

Also, with the recent trend toward smaller and lighter electronic devices, there is an increasing need for ferroelectric thin film devices in which a thin-film technology is utilized.

Herein, pyroelectric and piezoelectric thin film devices will be described below as representatives of such ferroelectric thin film devices. Piezoelectric devices utilize the piezoelectric effect of a ferroelectric material, and are widely used as functional devices such as actuators and stress sensors. Actuators generate a displacement or vibration in response to an applied voltage to a ferroelectric (piezoelectric) material. Stress sensors generate a voltage in response to a strain produced in a piezoelectric material. Pyroelectric devices detect light (including infrared light) utilizing the pyroelectric effect of a ferroelectric material, and are widely used as infrared human body sensors, etc.

Examples of piezoelectric devices utilizing a lead-free piezoelectric material are described below. JP 2007-019302 A discloses a piezoelectric thin film device including, on a substrate, a lower electrode, a piezoelectric thin film and an upper electrode. The piezoelectric thin film is made of an alkali niobate-based perovskite dielectric material of a chemical formula $(Na_xK_yLi_z)NbO_3$ (where $0<x<1$, $0<y<1$, $0 \leq z<1$, and $x+y+z=1$). A buffer layer of a perovskite crystal structure material is formed between the piezoelectric thin film and the lower electrode. The perovskite buffer layer is highly preferentially (001), (100), (010) or (111) oriented. According to this JP 2007-019302 A, the piezoelectric thin film device utilizing the lead-free lithium potassium sodium niobate thin film exhibits sufficient piezoelectric properties.

Piezoelectric devices have a basic structure of a piezoelectric material sandwiched between two electrodes and are micro fabricated into a beam or tuning fork shape depending on their application. So, micro fabrication processes are important in order to put piezoelectric devices using lead-free piezoelectric materials to practical use.

JP 2012-033693 A discloses a method of processing a wafer having thereon a piezoelectric thin film of a chemical formula $(K_{1-x}Na_x)NbO_3$ (where $0.4 \leq x \leq 0.7$). The method includes the first step of ion etching the piezoelectric thin film on wafer in an Ar gas atmosphere and the second step of reactive ion etching the resulting wafer in a fluorine based reactive gas/Ar mixture atmosphere. According to this JP 2012-033693 A, a fine pattern of the piezoelectric thin film can be formed, thereby providing a highly reliable and low cost piezoelectric thin film device.

JP 2012-244090 A discloses a method for manufacturing a piezoelectric film device, which includes the steps of: forming a lower electrode on a substrate; forming, on the lower electrode, a piezoelectric film of an alkali niobate-based perovskite material represented by a chemical formula $(K_{1-x}Na_x)NbO_3$; and wet-etching the piezoelectric film using a hydrogen fluoride-based etchant and a Cr film etch mask. According to this JP 2012-244090 A, the Cr mask and the lower electrode are not etched by the hydrogen fluoride-based etchant; therefore, the piezoelectric film alone can be selectively etched. Thus, a fine pattern of the piezoelectric film can be accurately formed in a short time.

As described above, niobate-based ferroelectric materials (such as potassium sodium niobate $((K_{1-x}Na_x)NbO_3)$) are very promising as lead-free ferroelectric materials. In order to put thin film devices using niobate-based ferroelectric materials as alternatives for PZTs to practical use and mass production, it is very important to develop and establish techniques for micro fabricating niobate-based ferroelectric thin film devices with a high dimensional accuracy and at low cost.

However, niobate-based ferroelectric materials are relatively new materials, and their micro fabrication techniques are still under development. In these respects, the above-disclosed manufacturing techniques have the following disadvantages: The dry etching technique of the above JP 2012-033693 A would achieve a high dimensional accuracy. However, this dry etching technique requires an expensive etching apparatus because it is a vacuum process. In addition, the technique has only a relatively low throughput.

The wet etching technique of the above JP 2012-244090 A would achieve a relatively high throughput and therefore have an advantage over dry etching processes in terms of manufacturing cost. However, niobate-based ferroelectric materials are chemically stable and are therefore difficult to fine-etch using an etchant other than hydrogen fluoride-based etchants. Hydrogen fluoride-based etchants require very careful handling for safety reasons and the usable etch masks are limited. These disadvantages increase the manufacturing cost and therefore might impair or offset the above-mentioned manufacturing cost advantage.

SUMMARY OF THE INVENTION

In view of the foregoing, it is an objective of the present invention to solve the above problems and provide a method for micro-fabricating a ferroelectric thin film device utilizing a lead-free niobate-system ferroelectric material with a high dimensional accuracy and at lower than conventional cost.

(I) According to one aspect of the present invention, there is provided a method for manufacturing a niobate-system ferroelectric thin film device, including:

a lower electrode film formation step of forming a lower electrode film on a substrate;

a niobate-system ferroelectric thin film formation step of forming a niobate-system ferroelectric thin film on the lower electrode film;

an etch mask formation step of forming a desired etch mask pattern on the niobate-system ferroelectric thin film; and a ferroelectric thin film etching step of forming a desired fine pattern of the niobate-system ferroelectric thin film by wet etching using an etchant including an aqueous alkaline solution of a chelating agent.

In the above aspect (I) of the invention, the following modifications and changes can be made.

(i) The chelating agent is ethylene diamine tetraacetic acids or diethylene triamine pentaacetic acid; the aqueous alkaline solution is an aqueous ammonia solution; and the etchant further includes an aqueous hydrogen peroxide solution.

(ii) The ethylene diamine tetraacetic acids are at least one selected form among ethylene diamine tetraacetic acid, ethylene diamine tetraacetic acid disodium salt dihydrate, ethylene diamine tetraacetic acid trisodium salt trihydrate, ethylene diamine tetraacetic acid tetrasodium salt tetrahydrate, ethylene diamine tetraacetic acid dipotassium salt dihydrate, ethylene diamine tetraacetic acid tripotassium salt dihydrate and ethylene diamine tetraacetic acid diammonium salt.

(iii) The etch mask is made of a silicon oxide film.

(iv) At the ferroelectric thin film etching step, the etchant has a temperature of 45° C. or higher and lower than 100° C.

(v) The niobate-system ferroelectric thin film is made of potassium sodium niobate or lithium niobate.

(vi) The lower electrode film is made of platinum.

(vii) The niobate-system ferroelectric thin film has a device-forming surface on which the niobate-system ferroelectric thin film device is formed; the niobate-system ferroelectric thin film includes one or more crystal grains having a crystal system and crystal planes including a (001) crystal plane; the crystal system of the niobate-system ferroelectric thin film is pseudo cubic or tetragonal; the niobate-system ferroelectric thin film is formed by sputtering in such a manner that the (001) crystal plane of the one or more crystal grains is preferentially oriented parallel to the device-forming surface.

(viii) The substrate is a silicon substrate having a thermal oxide layer thereon.

(ix) The method further comprises: an upper electrode formation step of forming an upper electrode over a desired fine pattern of the niobate-system ferroelectric thin film; and a dicing step of dicing the substrate having thereon the niobate-system ferroelectric thin film having thereon the upper electrode into one or more chips.

ADVANTAGES OF THE INVENTION

According to the present invention, it is possible to wet etch a lead-free niobate-system ferroelectric thin film into a desired fine pattern with a high dimensional accuracy and at a lower cost than before. As a result, it is possible to provide a niobate-system ferroelectric thin film device in which a desired fine pattern of the ferroelectric thin film is formed at low manufacturing cost.

DETAILED DESCRIPTION OF THE PREFERRED EMBODIMENTS

The present inventors focused on niobate-system (niobate-based) ferroelectric materials [specifically, potassium sodium niobate ($(K_{1-x}Na_x)NbO_3$, KNN) and lithium niobate ($LiNbO_3$, LN)] as lead-free ferroelectric materials that were expected to have pyroelectric or piezoelectric properties comparable to those of lead zirconate titanates ($Pb(Zr_{1-x}Ti_x)O_3$, PZT), and intensively investigated wet etching techniques usable for the niobate-system ferroelectric materials focused. After various investigations, the following results were obtained. Niobate-system ferroelectric materials are conventionally thought to be difficult to fine-etch using an etchant other than hydrogen fluoride-based etchants. However, niobate-system ferroelectric materials can be wet-etched using novel etchants containing an aqueous alkaline solution of a chelating agent with high dimensional accuracy. In addition, silicon oxide films can be used as an etch mask because the new etchants do not contain hydrogen fluoride.

Chelating agents are thought to be less harmful to the human body and environment, in comparison with hydrogen fluoride. So, simpler and less inexpensive etching apparatuses can be used, thus considerably reducing manufacturing and equipment cost. Further, because cheap and commonly used silicon oxide films can be used as an etch mask, the etching process using this new etchant is simplified, thus considerably reducing manufacturing process cost. The present invention is based on these new findings.

Preferred embodiments of the present invention will be described below with reference to the accompanying drawings. Hereinafter, the invention will be described using mainly KNN as the niobate-system ferroelectric material.

However, the invention is not limited to the specific embodiments described below, but various combinations and modifications are possible without departing from the spirit and scope of the invention.

Figure 1:
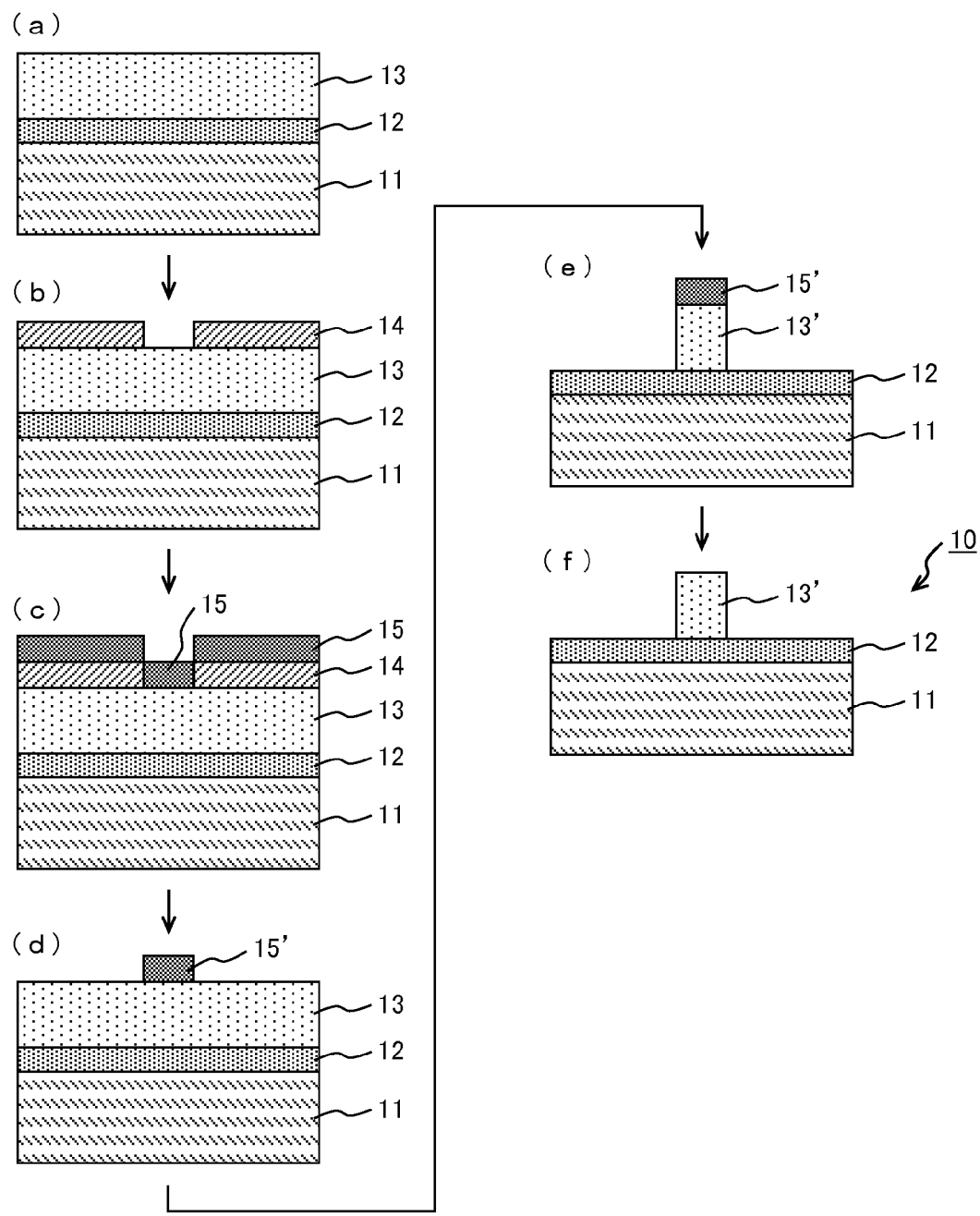
FIG. 1 is a schematic illustration showing an enlarged cross sectional view of manufacturing steps (from a first step to a ferroelectric thin film etching step) of a niobate-system ferroelectric thin film device according to the present invention.

FIG. 1 is a schematic illustration showing an enlarged cross sectional view of first half manufacturing steps (from a first step to a ferroelectric thin film etching step) of a niobate-system ferroelectric thin film device according to the present invention. While a cleaning and a drying steps are not described below, it is preferable that these steps are performed as needed.

First, a substrate 11 is prepared. A material of the substrate 11 is not particularly limited, and may be properly selected based on applications of the pyroelectric or piezoelectric device. For example, silicon (Si), SOI (Silicon on Insulator), quartz glass, gallium arsenide (GaAs), sapphire ($Al_2O_3$), metal (such as stainless steel), magnesium oxide (MgO), and strontium titanate ($SrTiO_3$) may be used. When an electrically conductive material is used as the substrate 11, its surface is preferably covered with an electrical insulating film (e.g. an oxide film). There is no particular limitation on a method of forming the oxide film. For example, thermal oxidation and chemical vapor deposition (CVD) are suitable.

(Lower Electrode Film Formation Step)

At this lower electrode film formation step, a lower electrode film 12 is formed on the substrate 11 (see FIG. 1(a)). There is no particular limitation on a material of the lower electrode film 12; however, platinum (Pt) and an alloy mainly containing platinum are preferable. Because Pt is inert to an etchant used in a later-described ferroelectric film etching step, Pt can be used as an etch stop. There is no particular limitation on a method for forming the lower electrode film 12. For example, sputtering is suitable. The arithmetic mean surface roughness (Ra) of the lower electrode film 12 is preferably 0.86 nm or less in order to achieve sufficient pyroelectric (or piezoelectric) performance of a later-formed niobate-system ferroelectric thin film 13.

(Ferroelectric Thin Film Formation Step)

At this ferroelectric thin film formation step, the niobate-system ferroelectric thin film 13 is formed on the lower electrode film 12 (see FIG. 1(a)). KNN (($K_{1-x}Na_x$)$NbO_3$, $0.4 \leq x \leq 0.7$) is preferable as a material of the niobate-system ferroelectric thin film 13. Sputtering (with a use of a sintered KNN target) and electron beam deposition are preferable as a method for forming the niobate-system (KNN) ferroelectric thin film 13. This is because sputtering and electron beam deposition are excellent in terms of reproducibility, formation rate, running cost and orientation control of KNN crystal films. Preferably, in order to achieve sufficient pyroelectric (or piezoelectric) performance, a crystal system of the niobate-system (KNN) ferroelectric thin film 13 is pseudo cubic or tetragonal and the (001) crystal plane is preferentially oriented parallel to a device forming surface.

The KNN thin film 13 may contain, as impurities, lithium (Li), tantalum (Ta), antimony (Sb), calcium (Ca), copper (Cu), barium (Ba) and titanium (Ti) in a total amount of 5 atomic percent or less.

LN ($LiNbO_3$) is also preferable as a material of the niobate-system ferroelectric thin film 13 for the same reason as described above for KNN.

(Etch Mask Formation Step)

At this etch mask formation step, an etch mask used for later-described wet etching is formed on the ferroelectric thin film 13. First, a photoresist pattern 14 is formed on the ferroelectric thin film 13 using a photolithography process (see FIG. 1(b)). Next, an unpatterned etch mask film 15 is formed over the photoresist pattern 14 (see FIG. 1(c)). Then, a desired etch mask pattern 15' is formed using a lift-off process (see FIG. 1(d)). There is no particular limitation on a material of the etch mask layer 15 (etch mask pattern 15') so long as it has a sufficient resistance to later-described etchants. For example, a sputtered noble metal film (such as Au, Pt and Pd) and an oxide film (such as silicon oxide) are suitable. Of these materials, a silicon oxide film (e.g. $SiO_2$ film) is particularly preferable in view of the ease of use and the low cost. The etch mask pattern 15' may be formed using a process other than the above-described photolithography/lift-off process.

(Ferroelectric Thin Film Etching Step)

At this ferroelectric thin film etching step, the niobate-system ferroelectric thin film 13 is wet etched to form a fine pattern defined by the etch mask pattern 15'. The etchant used at this step preferably contains an aqueous alkaline solution of a chelating agent and does not contain hydrogen fluoride. The use of such a hydrogen fluoride-free etchant reduces the safety cost conventionally needed to use hydrogen fluoride-based etchants.

An etchant used at this step is explained below in more detail. Preferably, ethylene diamine tetraacetic acids (EDTAs) or diethylene triamine pentaacetic acid (DTPA) is used as a chelating agent. The EDTAs are preferably at least one selected form among ethylene diamine tetraacetic acid (EDTA), ethylene diamine tetraacetic acid disodium salt dihydrate (EDTA-2Na), ethylene diamine tetraacetic acid trisodium salt trihydrate (EDTA-3Na), ethylene diamine tetraacetic acid tetrasodium salt tetrahydrate (EDTA-4Na), ethylene diamine tetraacetic acid dipotassium salt dihydrate (EDTA-2K), ethylene diamine tetraacetic acid tripotassium salt dihydrate (EDTA-3K) and ethylene diamine tetraacetic acid diammonium salt (EDTA-$2NH_3$).

These chelating agents are highly soluble in aqueous alkaline solutions; so, an aqueous alkaline solution (such as aqueous ammonia solutions ($NH_4OH$) and aqueous sodium hydroxide solutions (NaOH aq.)) is used as a solvent for the chelating agent. Adding an aqueous hydrogen peroxide solution ($H_2O_2$ aq.) to the above-described etchants is more preferable in order to enhance the etching activity.

Concentration of the chelating agent in the etchant is preferably from 0.01 mol/L to 0.1 mol/L. When the chelating agent concentration is less than 0.01 mol/L, the etching activity is insufficient. When the chelating agent concentration exceeds 0.1 mol/L, the etching activity becomes saturated. Preferably, the etchant is prepared to have a hydrogen ion exponent (pH) of 9 or more and less than 14 by adjusting the preparation of the aqueous alkaline solution. When the pH is less than 9, solubility of the chelating agent is insufficient, resulting in an insufficient etching activity. Concentration of the hydrogen peroxide is preferably from 2 mol/L to 8 mol/L. When the hydrogen peroxide concentration is less than 2 mol/L, the etching activity is insufficient; when the concentration exceeds 8 mol/L, the etching activity becomes saturated. All the chemicals used to prepare the above-described etchants can be commercially available.

The $SiO_2$ etch mask pattern 15' and the lower electrode film 12 (Pt or Pt alloy) are inert (resistant) to the above-described etchants; thus, the niobate-system ferroelectric thin film pattern 13' (which is a desired fine pattern of the niobate-system ferroelectric thin film 13) can be formed (see FIG. 1(e)). The etching activity can be enhanced by raising the etching temperature (etchant temperature) from room temperature to a higher temperature. The etching temperature is preferably 45° C. or higher, more preferably 60° C. or higher and even more preferably 80° C. or higher. However, in view of operational safety, the etching temperature is preferably lower than 100° C.

The etching reaction mechanism of the invention is not fully clarified. But, the chelating agent and the hydrogen peroxide by coexisting with each other would react with niobium to form a chemically very stable chelate peroxide (e.g. $Nb-H_2O_2$-EDTA), which is probably effective in etching the niobate-system ferroelectric thin film 13.

After the above-described wet etching, the etch mask pattern 15' is removed using an etchant for silicon oxide (e.g. buffered HF); thereby, a substrate 10 having thereon a desired fine pattern of the niobate-system ferroelectric thin film 13 (the niobate-system ferroelectric thin film pattern 13') is formed (see FIG. 1(f)).

(Upper Electrode Formation Step)

Figure 2:
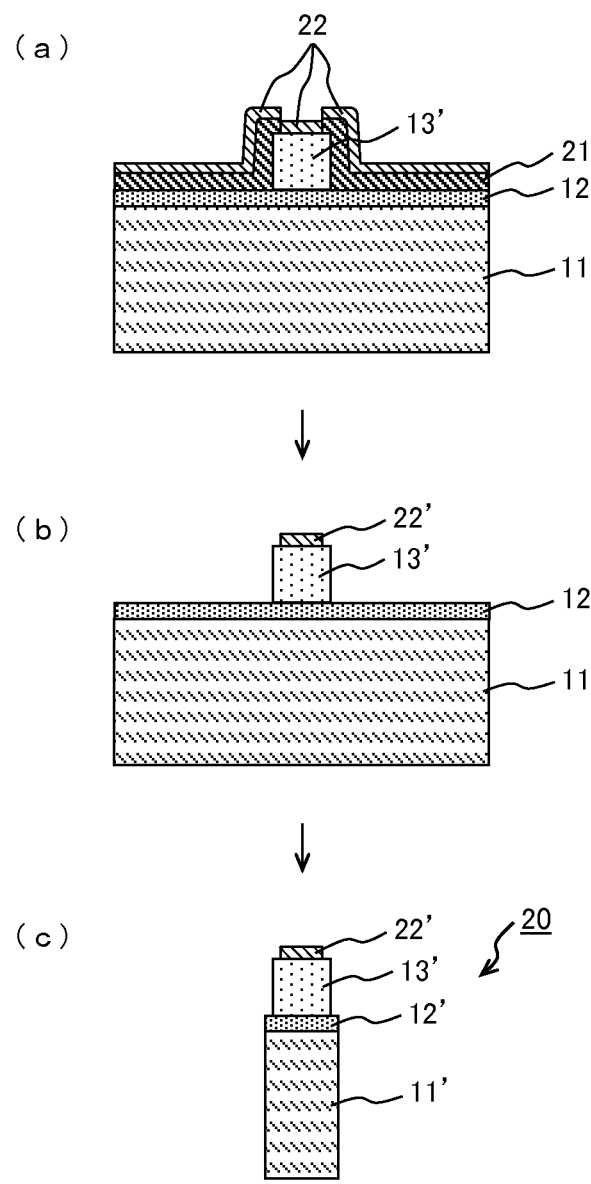
FIG. 2 is a schematic illustration showing an enlarged cross sectional view of manufacturing steps (from a ferroelectric thin film etching step to a final step) of a niobate-based ferroelectric thin film device according to the invention.

FIG. 2 is a schematic illustration showing an enlarged cross sectional view of latter half manufacturing steps (from a ferroelectric thin film etching step to a final step) of the niobate-system ferroelectric thin film device according to the present invention. At this upper electrode formation step, an upper electrode is formed on the niobate-system ferroelectric thin film having a desired fine pattern (niobate-system ferroelectric thin film pattern 13'). First, a photoresist pattern 21 (corresponding to the reverse (negative) pattern of a later-formed upper electrode 22') is formed using a photolithography process. Then, an upper electrode film 22 is formed over the photoresist pattern 21 (see FIG. 2(a)). Next, the area other than an upper electrode 22' is removed using a lift-off process (see FIG. 2(b)). Suitable materials of the upper electrode film 22 (upper electrode 22') are, for example, aluminum (Al), gold (Au), nickel (Ni) and Pt.

(Dicing Step)

At this dicing step, the substrate having the niobate-system ferroelectric thin film pattern 13' and the upper electrode 22' is diced into a niobate-system ferroelectric thin film device chip 20 (see FIG. 2(c)). Meanwhile, the reference numeral 11' designates the diced substrate of the chip 20 and numeral 12' designates the lower electrode in the chip 20. Thus, the formation of the niobate-system ferroelectric thin film device chip 20 having thereon a desired fine pattern of the niobate-system ferroelectric thin film is completed.

EXAMPLES

The present invention will be described more specifically below by way of examples. However, the invention is not limited to the specific examples below.

{Potassium Sodium Niobate (KNN) Thin Film Device}

(Fabrication of KNN Thin Film-on-Substrate)

The KNN thin film-on-substrate 10 was fabricated according to the manufacturing steps illustrated in FIG. 1. A 4-inch (100) Si wafer with thermal oxide (Si wafer thickness of 0.525 mm; oxide thickness of 200 nm) was used as the substrate 11.

First, a 2.2-nm thick Ti layer was formed on the substrate 11 by RF magnetron sputtering in order to enhance adhesion between the substrate 11 and the lower electrode film 12. Next, the lower electrode film 12 was formed by forming a 205-nm thick Pt layer on the Ti layer by RF magnetron sputtering (see FIG. 1(a)). The sputtering conditions for the Ti adhesive layer and Pt lower electrode film 12 were as follows: targets of pure Ti (for the Ti layer) and pure Pt (for the Pt electrode); substrate temperature of 250° C.; discharge power of 200 W; sputtering gas of Ar; and pressure of 2.5 Pa. The measured arithmetic mean surface roughness of the thus formed lower electrode film 12 was 0.86 nm or less. The sputtering was carried out using a RF sputtering machine (ULVAC SH-350-T10) (the same machine was used in all the remaining sputtering processes described below).

After the formation of the Pt lower electrode film 12, the niobate-system ferroelectric thin film 13 was formed by forming a 2-μm thick KNN (($K_{0.35}Na_{0.65}$)$NbO_3$) thin film on the lower electrode film 12 by RF magnetron sputtering (see FIG. 1(a)). The sputtering condition for the KNN thin film 13 was as follows: target of sintered ($K_{0.35}Na_{0.65}$)$NbO_3$; substrate temperature of 400 to 600° C.; discharge power of 700 to 800 W; sputtering gas of $O_2$/Ar mixture ($O_2$/Ar ratio=0.005); and pressure of 0.3 to 1.3 Pa.

(Evaluation of Crystal Structure of Ferroelectric Thin Film)

Perovskite KNN crystals have a tetragonal structure in which, normally, the c-axis is longer than the a-axis (c/a>1). That is, when a tetragonal crystal satisfies the condition c/a>1, the crystal is more stable and its crystallinity is high. When an electric field is applied along the c-axis of a perovskite-type ferroelectric crystal with a small initial strain, a larger polarization (and thus a higher gain in piezoelectric or ferroelectric performance) is obtained.

However, a tetragonal thin crystalline film formed on a substrate, unlike bulk crystalline body, tends to have some lattice strain affected by the substrate or an underlying layer. In order to investigate this phenomenon, the crystal systems of the above-described KNN thin films on substrates were examined by X-ray diffraction (XRD) measurement. The result was that the KNN thin films were classified into two types. The first type exhibited the relationship $c/a \leq 1$, and therefore had a pseudo cubic structure which is more like a cubic structure than a tetragonal structure. The second type exhibited the relationship c/a>1, and therefore had a crystal structure which is close to a normal tetragonal structure.

(Etching Test)

After the above-described KNN film formation, the photoresist pattern 14 was formed on the KNN thin film 13 by applying, exposing and developing a photoresist (OFPR-800 available from TOKYO OHKA KOGYO CO., LTD) (see FIG. 1(b)). Next, the etch mask layer 15 was formed by forming a 600-nm thick $SiO_2$ film with RF magnetron sputtering (see FIG. 1(c)). The sputtering condition for the $SiO_2$ film was as follows: target of quartz plate; substrate temperature of 25° C.; discharge power of 400 W; sputtering gas of $O_2$/Ar mixture ($O_2$/Ar ratio=0.033); and pressure of 0.7 Pa. Then, the etch mask pattern 15' was formed on the KNN thin film 13 by removing the photoresist pattern 14 with acetone cleaning (lift off) (see FIG. 1(d)).

Etching test pieces (20 mm×20 mm) were cut out from the thus fabricated substrate having thereon the KNN thin film 13 and the etch mask pattern 15'. Then, the KNN thin film pattern 13' was formed on each etching test piece by wet etching using a different test etchant and a different etching condition (see FIGS. 1(e) and 1(f)). As described above, the KNN thin film-on-substrates from which the etching test pieces were cut out included those whose KNN film had a pseudo cubic structure and those whose KNN film had a tetragonal structure.

The chemicals used to prepare the test etchants were: ethylene diamine tetraacetic acid (EDTA, Wako Pure Chemical Industries, Ltd., research reagent, purity 99.5%); aqueous ammonia ($NH_4OH$, Kanto Chemical Co., Inc., for electronic industry use, content 29%); and aqueous hydrogen peroxide ($H_2O_2$ aq., Kanto Chemical Co., Inc., for electronic industry use, content 30%). These chemicals were mixed in the amounts shown in Table 1. Another set of test etchants were prepared by using ethylene diamine tetraacetic acid disodium salt dihydrate (EDTA-2Na, Dojin Chemical Research Center, Ltd., purity≥99.5%) instead of EDTA. Similarly to the above, EDTA-2Na, $NH_4OH$ and $H_2O_2$ were mixed in the amounts shown in Table 1. The etching temperature (etchant temperature) was varied from ambient temperature (20° C.) to 94° C. as shown in Table 1.

TABLE 1

Etching Methods and Etching Test Results.

| | KNN Crystal System | EDETA (g) | EDETA-2Na (g) | $NH_4OH$ (mL) | $H_2O_2$ aq. (mL) | Etchant Temp. (° C.) | Etching Rate (nm/min) |
|---|---|---|---|---|---|---|---|
| Inventive Example 1 | Pseudo Cubic (c/a ≤ 1) | 5 | — | 37 | 125 | 45 | 3.7 |
| Inventive Example 2 | | | | | | 50 | 5 |
| Inventive Example 3 | | | | | | 55 | 6.7 |
| Inventive Example 4 | | | | | | 60 | 23 |
| Inventive Example 5 | | | | | | 70 | 38 |
| Inventive Example 6 | | | | | | 75 | 65 |
| Inventive Example 7 | | | | | | 80 | 85 |
| Inventive Example 8 | | | | | | 82 | 105 |
| Inventive Example 9 | | 5 | — | 15 | 125 | 50 | 3.5 |
| Inventive Example 10 | | 5 | — | 7 | 125 | 50 | 2.7 |
| Inventive Example 11 | | 10 | — | 37 | 125 | 45 | 4 |
| Inventive Example 12 | | | | | | 50 | 5.5 |
| Inventive Example 13 | | 10 | — | 37 | 75 | 50 | 5 |
| Inventive Example 14 | Tetragonal (c/a > 1) | 15 | — | 111 | 375 | 60 | 4.9 |
| Inventive Example 15 | | | | | | 67 | 8.7 |
| Inventive Example 16 | | | | | | 70 | 11 |
| Inventive Example 17 | | | | | | 75 | 20 |
| Inventive Example 18 | | | | | | 83 | 28 |
| Inventive Example 19 | | | | | | 86 | 45 |
| Inventive Example 20 | | | | | | 90 | 89 |
| Inventive Example 21 | | | | | | 92 | 105 |
| Inventive Example 22 | | | | | | 93 | 118 |
| Inventive Example 23 | | — | 15 | 111 | 375 | 84 | 26 |
| Inventive Example 24 | | | | | | 94 | 33 |
| Comparative Example 1 | Pseudo Cubic (c/a ≤ 1) | 5 | — | 37 | 125 | 20 | 0.17 |
| Comparative Example 2 | | 5 | — | 7 | 125 | 35 | 0.6 |
| Comparative Example 3 | | 5 | — | — | 125 | 50 | — |
| Comparative Example 4 | | — | — | 37 | 125 | 50 | — |
| Comparative Example 5 | | 5 | — | 37 | — | 50 | — |

(Etching Activity Test)

(1) Etching Rate

Each etching test was performed for the same period of time and then the SiO$_2$ mask was removed using buffered HF (BHF 16, Kanto Chemical Co., Inc., for semiconductor industry use, content 22%). Then, a step height of the selectively etched KNN thin film was measured, and etching activity was evaluated by an average etching rate (=average (step height)/(etching time) ratio). The result was shown in Table 1.

Table 1 shows that the chelating agent concentration has only a comparatively small influence on the etching rate (see Inventive Examples 1, 2, 11 and 12). The hydrogen peroxide concentration, too, has a comparatively small influence on the etching rate (see Inventive Examples 12 and 13). When the concentration of the aqueous alkaline solution is reduced, the etching rate decreases slightly (see Inventive Examples 2, 9 and 10). This is probably because the reduction in the etchant pH (i.e. lowering of the alkalinity of the etchant) causes a reduction in the solubility of the chelating agent.

Figure 3:
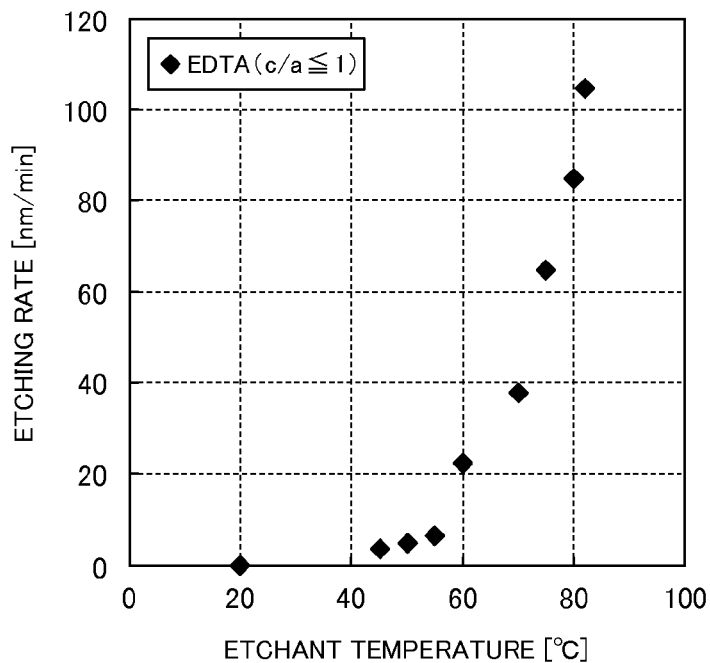
FIG. 3 is a graph showing a relationship between etching rate and etchant temperature.

By contrast, the etching temperature (etchant temperature) has a large influence on the etching rate. FIG. 3 is a graph showing, for Inventive Examples 1 to 8 and Comparative Example 1, a relationship between the etching rate and the etchant temperature. As shown in FIG. 3, the etching rate increases with increasing etchant (etching) temperature.

Figure 4:
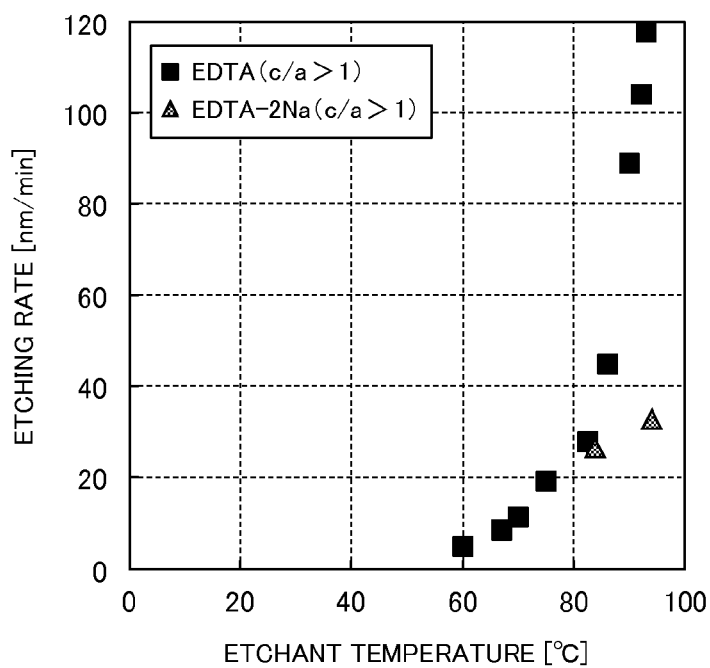
FIG. 4 is a graph showing another relationship between etching rate and etchant temperature.

In addition, the crystal structure of the KNN thin film, too, has a large influence on the etching rate. FIG. 4 is a graph showing, for Inventive Examples 14 to 24, a relationship between the etching rate and the etchant temperature. Like FIG. 3, FIG. 4, too, shows that the etching rate increases with increasing etchant (etching) temperature. A difference here is that an upward rising curve of the etching rate in FIG. 4 (Inventive Examples 14 to 22) shifts to higher temperatures than the curve in FIG. 3 (Inventive Examples 1 to 8). As shown in Table 1, the crystal structure of the KNN thin films of Inventive Examples 14 to 22 is different from that of Inventive Examples 1 to 8.

A probable mechanism of this etching rate difference shown in FIGS. 3 and 4 is as follows: The KNN thin films of Inventive Examples 14 to 22 have a tetragonal crystal structure (c/a>1), while those of Inventive Examples 1 to 8 have a pseudo cubic crystal structure (c/a≤1). Thus, the KNN thin films of Inventive Examples 14 to 22 have a crystal structure which is relatively close to the natural tetragonal structure of KNN crystals. Therefore, their crystal structure is more stable and their internal energy is lower. So, the chemical reactivity between the KNN thin films and the etchants is poorer; therefore, higher temperatures are needed to promote the etching reaction. In contrast, the KNN thin films of Inventive Examples 1 to 8 have a pseudo cubic structure which is different from the natural tetragonal structure of KNN crystals. Thus, they have a relatively large internal strain and therefore a higher internal energy. So, they more easily react with the etchant. Thus, the upward rising curve of the etching rate shifts to lower temperatures.

Also, as shown in Table 1 and FIG. 4, the etchants of Inventive Examples 23 and 24 prepared by using EDTA-2Na instead of EDTA, too, exhibit a sufficiently high etching rate.

In contrast, in Comparative Example 2, the alkalinity of the etchant is low and the etchant temperature is low; as a result, the etching rate is insufficient. The etchant of Comparative Example 3 contains no aqueous alkaline solution; therefore, the chelating agent does not dissolve in the etchant almost at all. Thus, no etching reaction occurs. The etchant of Comparative Example 4 contains no chelating agent; therefore, like Comparative Example 3, no etching reaction occurs. Also, the etchant of Comparative Example 5 which does not contain any aqueous hydrogen peroxide solution exhibits no etching activity.

Next, acceptable etching rate in terms of mass productivity will be discussed briefly below. As shown in Table 1, the etching rates of Inventive Examples 1 to 3, 14 and 15 are lower than 10 nm/min and in a range of several nanometers per minute. These etching rates are roughly in the same range as those of dry etching processes. However, the etching of the invention is a wet process and therefore can simultaneously etch far more workpieces (e.g. wafers) than dry etching processes. For example, if a wet process can etch 100 workpieces (e.g. wafers) at the same time, its throughput is 100 times those of dry etching processes that can etch only one wafer at the same time. Thus, the etching process of the invention outperforms dry etching processes in terms of volume production efficiency even if the invention's etching rate is not higher than those of dry etching processes. In other words, a wet etching process having an etching rate of 2 nm/min or higher sufficiently contributes to a reduction in manufacturing cost.

(2) Etching Selectivity Ratio

Some of the etching test pieces were measured for (KNN thin film)/(SiO$_2$ mask) etching selectivity ratio. The measured ratio was 60 or higher.

(3) Damage to Underlying Layer (Such as Lower Electrode)

Some of the etching test pieces were tested for damage to the underlying layers (such as the lower electrode 12) by etching the KNN thin film 13 until the lower electrode 12 (Pt in this test) was exposed. The resulting Pt lower electrode 12 suffered no damage (such as etching or peeling). Thus, the lower electrode 12 can be used as an etching stopper.

(4) Etching Accuracy

Figure 5:
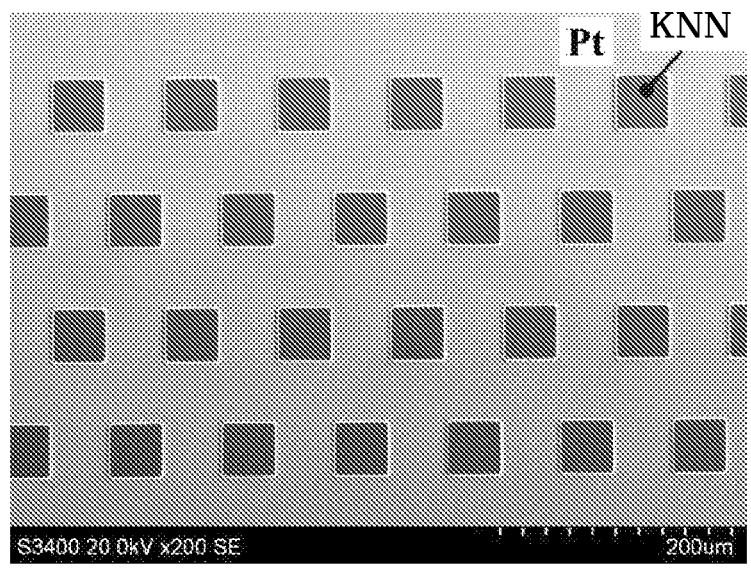
FIG. 5 is an SEM image showing a fine pad pattern (50 µm square, 50 µm spacing)
Figure 6:
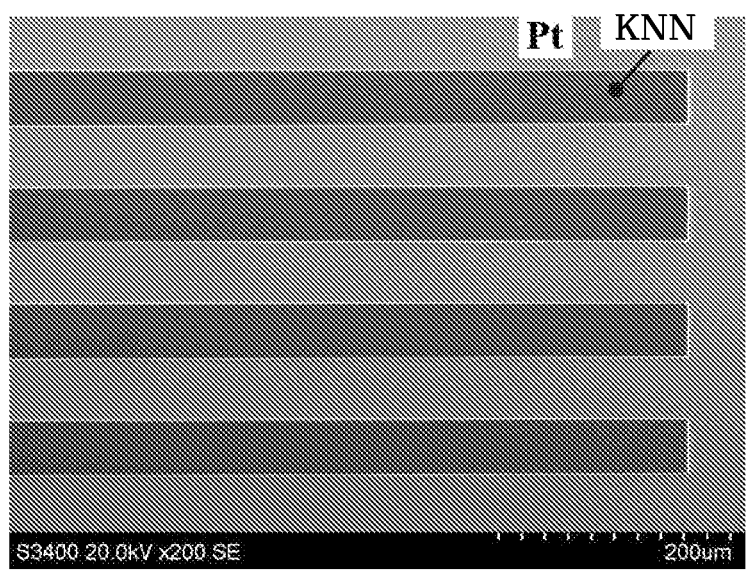
FIG. 6 is a SEM image showing a fine line and space pattern (50 µm line width, 50 µm spacing)

Fine patterns (a pad pattern, and a line and space pattern) of the KNN thin film 13 were formed using the etching method of Inventive Example 5 and were observed under a scanning electron microscope (SEM). FIG. 5 is an SEM image showing the resulting fine pad pattern (50 μm square, 50 μm spacing). FIG. 6 is an SEM image showing the resulting fine line and space pattern (50 μm line width, 50 μm spacing). As shown in FIGS. 5 and 6, both of the resulting patterns are sharply and accurately formed. The side etch was of comparable magnitude to the film thickness.

(Fabrication of Piezoelectric Thin Film Device)

According to the manufacturing steps shown in FIG. 2, the photoresist pattern 21 was formed over the KNN thin film pattern 13' patterned by the above-described invention's wet etching process. Then, a 100-nm thick Pt layer was formed as the upper electrode film 22 over the photoresist pattern 21 by RF magnetron sputtering (see FIG. 2(a)). The sputtering condition for the upper electrode film 22 was similar to that for the lower electrode film 12 and was as follows: target of pure Pt; substrate temperature of 250° C.; discharge power of 200 W; sputtering gas of Ar; and pressure of 2.5 Pa.

After that, the upper electrode 22' was formed on the KNN thin film pattern 13' by removing the photoresist pattern 21 with acetone cleaning (lift off) (see FIG. 2(b)). Then, the KNN thin film device chip 20 was formed by dicing.

In addition, as a standard sample, a 100-nm thick Pt upper electrode film 22 was formed on an unpatterned KNN thin film which was not subjected to the invention's wet etching process. This standard KNN film was not subjected to any etching processes and therefore had no etching damage. The ferroelectric characteristics of the invention's patterned KNN thin films 13' (which were subjected to the invention's wet etching process) were evaluated by comparing to those of this standard sample.

(Ferroelectric Characteristics Measurement)

The thus fabricated KNN thin film device chips 20 were measured for the polarization, permittivity and leakage current using a ferroelectric characteristics analyzer.

Figure 7:
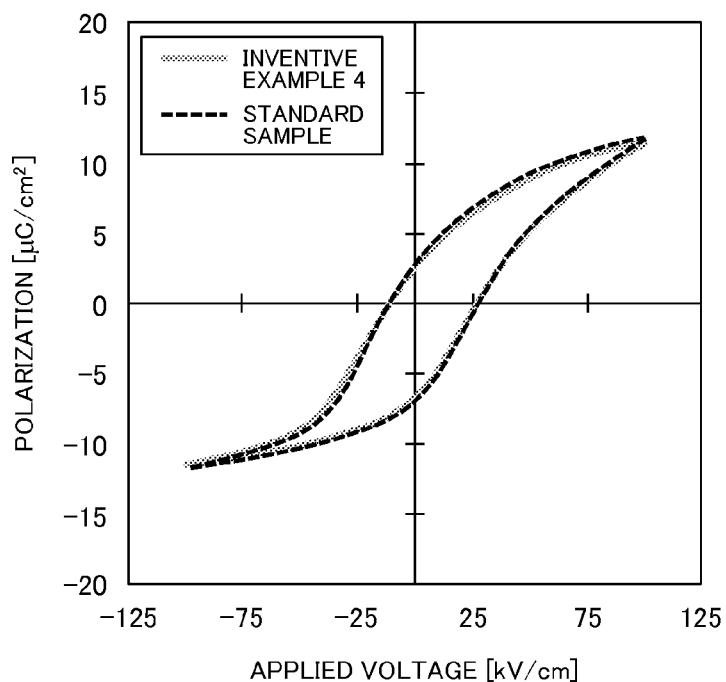
FIG. 7 is a graph showing, for Inventive Example 4 and a standard sample, a relationship between polarization and applied voltage.

FIG. 7 is a graph showing, for Inventive Example 4 and the standard sample, a relationship between the polarization and the applied voltage. As shown in FIG. 7, the polarization hysteresis loop of Inventive Example 4 entirely and closely overlaps that of the standard sample. Thus, the KNN thin film 13 which is subjected to the invention's wet etching process suffers no etching damage in terms of polarization characteristics.

The difference between permittivities of the standard sample and Inventive Example 4 was as small as about 1%. This degree of difference is within a range of sample to sample variation and measurement error. Thus, there is practically no difference between the two samples. The leakage current difference, too, was within the range of sample to sample variation and measurement error. Rather, in fact, Inventive Example 4 had a smaller leakage current than the standard sample. Again, there is practically no difference between the two samples.

These ferroelectric characteristics measurements demonstrate that ferroelectric thin films can be fine patterned by the invention's etching process without deteriorating their ferroelectric characteristics.

{Lithium Niobate (LN) Thin Film Device}

(Preparation of LN Substrate)

In this measurement, for experimental simplicity, a single crystalline lithium niobate ($LiNbO_3$, LN) substrate (10 mm×10 mm×0.5 mm) was used instead of an LN thin film. The photoresist pattern 14 was formed on the single crystalline LN substrate. Then, a 600-nm thick $SiO_2$ film was formed as the etch mask layer 15 over the photoresist pattern 14 by plasma CVD. Next, the etch mask pattern 15' was formed by a lift-off process.

(Etching Test and Evaluation)

Figure 8:
FIG. 8 is a SEM image showing a fine pattern formed on a single crystalline LN substrate.

An etching test and evaluation similar to the above-described etching test for the KNN thin films was performed on the single crystalline LN substrate having the etch mask pattern 15'. The resulting etching activity of the LN substrate was almost the same as the etching activity of the KNN thin films. FIG. 8 is a SEM image showing a fine pattern formed on the single crystalline LN substrate. As shown in FIG. 8, a sharp fine pattern is accurately formed.

{Etchant}

(Etching Test and Etching Activity Evaluation)

Various etchants containing a material other than EDTA and EDTA-2Na as the chelating agent were prepared. The chelating agents used were: diethylene triamine pentaacetic acid (DTPA, Wako Pure Chemical Industries, Ltd., research reagent, purity≥99%); ethylene diamine tetraacetic acid trisodium salt trihydrate (EDTA-3Na, Dojin Chemical Research Center, Ltd., purity≥98.0%); ethylene diamine tetraacetic acid tetrasodium salt tetrahydrate (EDTA-4Na, Dojin Chemical Research Center, Ltd., purity 98.0%); ethylene diamine tetraacetic acid dipotassium salt dihydrate (EDTA-2K, Dojin Chemical Research Center, Ltd., purity≥99.0%); ethylene diaminete traacetic acid tripotassium salt dihydrate (EDTA-3K, Dojin Chemical Research Center, Ltd., purity≥99.0%); and ethylene diamine tetraacetic acid diammonium salt (EDTA-2NH$_3$, Dojin Chemical Research Center, Ltd., purity≥99.0%). An etching test and evaluation similar to that used for the etchants containing EDTA or EDTA-2Na was performed on the etchants each containing a different one or combination of the above-listed chelating agents. The result was that the etchants containing a chelating agent other than EDTA and EDTA-2Na, too, exhibited almost the same etching activity as the etchants each containing EDTA or EDTA-2Na.

The above embodiments of the invention as well as the appended claims and figures show multiple characterizing features of the invention in specific combinations. The skilled person will easily be able to consider further combinations or sub-combinations of these features in order to adapt the invention as defined in the claims to his specific needs.

What is claimed is:

1. A method for manufacturing a niobate-system ferroelectric thin film device, comprising:
a lower electrode film formation step of forming a lower electrode film on a substrate;
a niobate-system ferroelectric thin film formation step of forming a niobate-system ferroelectric thin film on the lower electrode film;
an etch mask formation step of forming a desired etch mask pattern on the niobate-system ferroelectric thin film; and
a ferroelectric thin film etching step of forming a desired fine pattern of the niobate-system ferroelectric thin film by wet etching using an etchant including an aqueous alkaline solution of a chelating agent but not including hydrogen fluoride.

2. The method according to claim 1, wherein the chelating agent is ethylene diamine tetraacetic acids or diethylene triamine pentaacetic acid; the aqueous alkaline solution is an aqueous ammonia solution; and the etchant further includes an aqueous hydrogen peroxide solution.

3. The method according to claim 2, wherein the ethylene diamine tetraacetic acids are at least one selected from among ethylene diamine tetraacetic acid, ethylene diamine tetraacetic acid disodium salt dihydrate, ethylene diamine tetraacetic acid trisodium salt trihydrate, ethylene diamine tetraacetic acid tetrasodium salt tetrahydrate, ethylene diamine tetraacetic acid dipotassium salt dihydrate, ethylene diamine tetraacetic acid tripotassium salt dihydrate and ethylene diamine tetraacetic acid diammonium salt.

4. The method according to claim 2, wherein the etch mask is made of a silicon oxide film.

5. The method according to claim 2, wherein, at the ferroelectric thin film etching step, the etchant has a temperature of 45° C. or higher and lower than 100° C.

6. The method according to claim 2, wherein the niobate-system ferroelectric thin film is made of potassium sodium niobate or lithium niobate.

7. The method according to claim 3, wherein the etch mask is made of a silicon oxide film.

8. The method according to claim 3, wherein, at the ferroelectric thin film etching step, the etchant has a temperature of 45° C. or higher and lower than 100° C.

9. The method according to claim 3, wherein the niobate-system ferroelectric thin film is made of potassium sodium niobate or lithium niobate.

10. The method according to claim 1, wherein the etch mask is made of a silicon oxide film.

11. The method according to claim 1, wherein, at the ferroelectric thin film etching step, the etchant has a temperature of 45° C. or higher and lower than 100° C.

12. The method according to claim 1, wherein the niobate-system ferroelectric thin film is made of potassium sodium niobate or lithium niobate.

13. The method according to claim 1, wherein the lower electrode film is made of platinum.

14. The method according to claim 1, wherein the niobate-system ferroelectric thin film has a device-forming surface on which the niobate-system ferroelectric thin film device is formed; the niobate-system ferroelectric thin film includes one or more crystal grains having a crystal system and crystal planes including a (001) crystal plane; the crystal system of the niobate-system ferroelectric thin film is pseudo cubic or tetragonal; the niobate-system ferroelectric thin film is formed by sputtering in such a manner that the (001) crystal plane of the one or more crystal grains is preferentially oriented parallel to the device-forming surface.

15. The method according to claim 1, wherein the substrate is a silicon substrate having a thermal oxide layer thereon.

16. The method according to claim 1, further comprising:
   an upper electrode formation step of forming an upper electrode over a desired fine pattern of the niobate-system ferroelectric thin film; and
   a dicing step of dicing the substrate having thereon the niobate-system ferroelectric thin film having thereon the upper electrode into one or more chips.

* * * * *